(12) United States Patent
Herzel

(10) Patent No.: US 6,271,732 B1
(45) Date of Patent: Aug. 7, 2001

(54) RING OSCILLATOR INSENSITIVE TO SUPPLY VOLTAGE VARIATIONS

(76) Inventor: Frank Herzel, Zehmeplatz 10, D-15230 Frankfurt/Oder (DE)

( * ) Notice: Subject to any disclaimer, the term of this patent is extended or adjusted under 35 U.S.C. 154(b) by 0 days.

(21) Appl. No.: 09/399,272

(22) Filed: Sep. 17, 1999

(30) Foreign Application Priority Data

Sep. 17, 1998 (DE) .............................................. 198 44 306

(51) Int. Cl.⁷ .................. H03B 5/02; H03L 1/00
(52) U.S. Cl. .............................................. 331/57; 331/186
(58) Field of Search ................... 331/57, 185, 186

(56) References Cited

U.S. PATENT DOCUMENTS

| 5,418,498 | 5/1995 | DeVito et al. ........................... 331/57 |
| 5,559,476 | 9/1996 | Zhang et al. ............................ 331/57 |
| 5,764,110 | * 6/1998 | Ishibashi ................................ 331/57 |

FOREIGN PATENT DOCUMENTS

| 0805553 | 11/1997 | (EP) . |
| WO 96/38913 | 12/1996 | (WO) . |

OTHER PUBLICATIONS

Herzel et al.: Oscillator Jitter Due to Supply and Substrate Noise; IEEE,1998, Custom Integrated Circuits Conference; pp. 489–492.

* cited by examiner

Primary Examiner—Siegfried H. Grimm
(74) Attorney, Agent, or Firm—Karl Hormann

(57) ABSTRACT

A ring oscillator consisting of a plurality of series connected amplifier stages alternatingly energized by first and second voltages negatively correlated to each other. The output of the final amplifier stage is inverted and connected to the input of the first stage. The second voltage is derived from the first voltage by way of an inverting amplifier which is dimensioned to render the total sensitivity $K=df/dV_{DD}$ zero.

5 Claims, 2 Drawing Sheets

RING OSCILLATOR INSENSITIVE TO SUPPLY VOLTAGE VARIATIONS

BACKGROUND OF THE INVENTION

1. Field of the Invention

The invention, in general, relates to a ring oscillator and, more particularly, to a ring oscillator of the kind which is insensitive to variations in supply as well as substrate voltages to reduce jitter resulting from such voltages.

2. The Prior Art

For the reduction of jitter in a ring oscillator, WO 96/38913 and U.S. Pat. No. 5,559,476 suggest the use of current-controlled delay elements to isolate the influence of the supply noise on the stability of the frequency. Such elements are disadvantageous as they must be used for each stage of the ring oscillator. Furthermore, they require a control voltage the noise of which produces jitter.

U.S. Pat. No. 5,418,498 discloses a ring oscillator said to provide low jitter by utilizing gates and devices with time delays of excellent stability. However, the circuit is relatively complex.

EP0 805 553 A1 discloses an oscillator said to yield low jitter as a result of negative frequency feedback. Since it requires a second ring oscillator to provide the feedback, its disadvantages are rather obvious. Moreover, the second ring oscillator significantly increases the complexity of the circuit.

"Oscillator Jitter Due to Supply and Substrate Noise, IEEE 1998 Custom Integrated Circuits Conference, pp. 489–492" describes an alleged design optimization for MOS ring oscillators. However, jitter is only partly reduced.

OBJECT OF THE INVENTION

It is an object of the invention is to provide a structurally simple ring oscillator the frequency of which is insensitive to variations in the supply and the substrate voltage. By reducing the variations in its supply and substrate voltages, the ring oscillator in accordance with the invention provides for significantly reduced levels of jitter otherwise resulting from the noise of the supply and/or substrate voltage. In this manner, frequency-stable phase-locked loops (PLLs) can be realized. Such PLLs are required, e.g., for clock generation and clock recovery in high-speed digital circuits. Exemplary applications are microprocessors and memories.

SUMMARY OF THE INVENTION

In accordance with the invention, the object is accomplished by energizing a ring oscillator by two negatively correlated supply voltages, rather than by a single supply voltage, as has been conventional. As will be described, an inverting amplifier generates an auxiliary supply voltage $V_{DD2}$ from a global supply $V_{DD}$, such that $V_{DD2}$ decreases if $V_{DD}$ increases and vice versa, m stages of an n-stage ring oscillator operating from $V_{DD2}$ and the remaining stages operating is from $V_{DD}$. The total sensitivity $K=df/dV_{DD}$ is reduced to zero by proper dimensioning of the inverting amplifier, since the sensitivity contributions of the individual stages cancel each other. Hence, the mean error of a period (cycle jitter) and the so-called cycle-to-cycle jitter can be significantly reduced, since these quantities are approximately proportional to K. For differential CMOS ring oscillators the noise of the supply voltage and the noise of the substrate voltage are equivalent, since the corresponding sensitivities have the same absolute value, as outlined in "Oscillator Jitter Due to Supply and Substrate Noise, IEEE 1998 Custom Integrated Circuits Conference, pp. 489–492". Therefore, the principle underlying the instant invention is also suited for minimizing jitter due to substrate noise.

BRIEF DESCRIPTION OF THE SEVERAL DRAWINGS.

The novel features which are considered to be characteristic of the invention are set forth with particularity in the appended claims. The invention itself, however, in respect of its structure, construction and lay-out, as well as manufacturing techniques, together with other objects and advantages thereof, will best be understood from the following description of preferred embodiments when read with reference to the appended drawings, in which:

DETAILED DESCRIPTION OF PREFERRED EMBODIMENTS.

Figure 1:
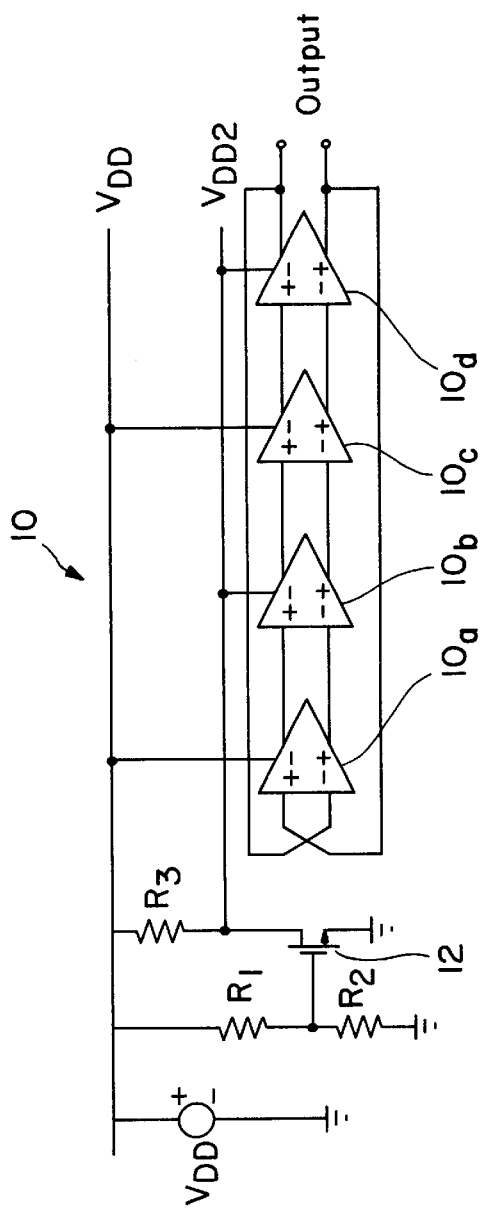
FIG. 1 depicts a four-stage differential ring oscillator.

FIG. 1 shows the structure of a ring oscillator 10 consisting of four identical stages 10a, 10b, 10c and 10d. The output of each stage is connected to the input of the following stage. The output of the final stage 10d is inverted and connected to the input of the first stage 10a. A second supply voltage $V_{DD2}$ is derived from a primary supply voltage $V_{DD}$ by means of an inverting amplifier. The inverting amplifier consists a MOS transistor 12 and series-connected resistances $R_1$ and $R_2$ in conjunction with a load resistance $R_3$. The first stage 10a and the third stage 10c are connected to the supply voltage $V_{DD}$, while the second stage 10b and the fourth or final stage 10d are energized by the secondary supply voltage $V_{DD2}$.

Figure 2:
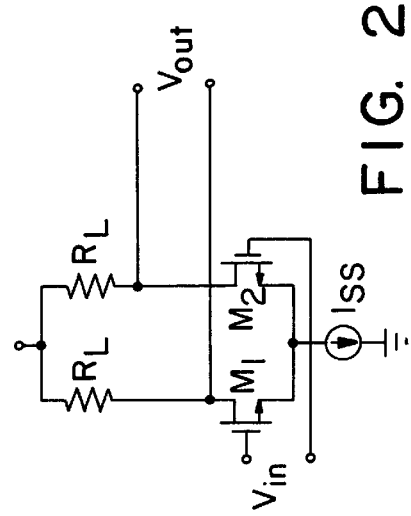
FIG. 2 depicts an exemplary structure of an individual stage of the ring oscillator of FIG. 1.

The structure of an individual stage 10a–d is shown in FIG. 2. In this embodiment, every stage consists of two MOS transistors $M_1$ and $M_2$, two identical resistances RL respectively connected to the drains of the MOS transistors $M_1$ and $M_2$, and a current source $1_{ss}$. FIG. 2 also depicts the input connections $V_{in}$ and the output connections $V_{out}$ which are not shown in FIG. 1, however.

Figure 3:
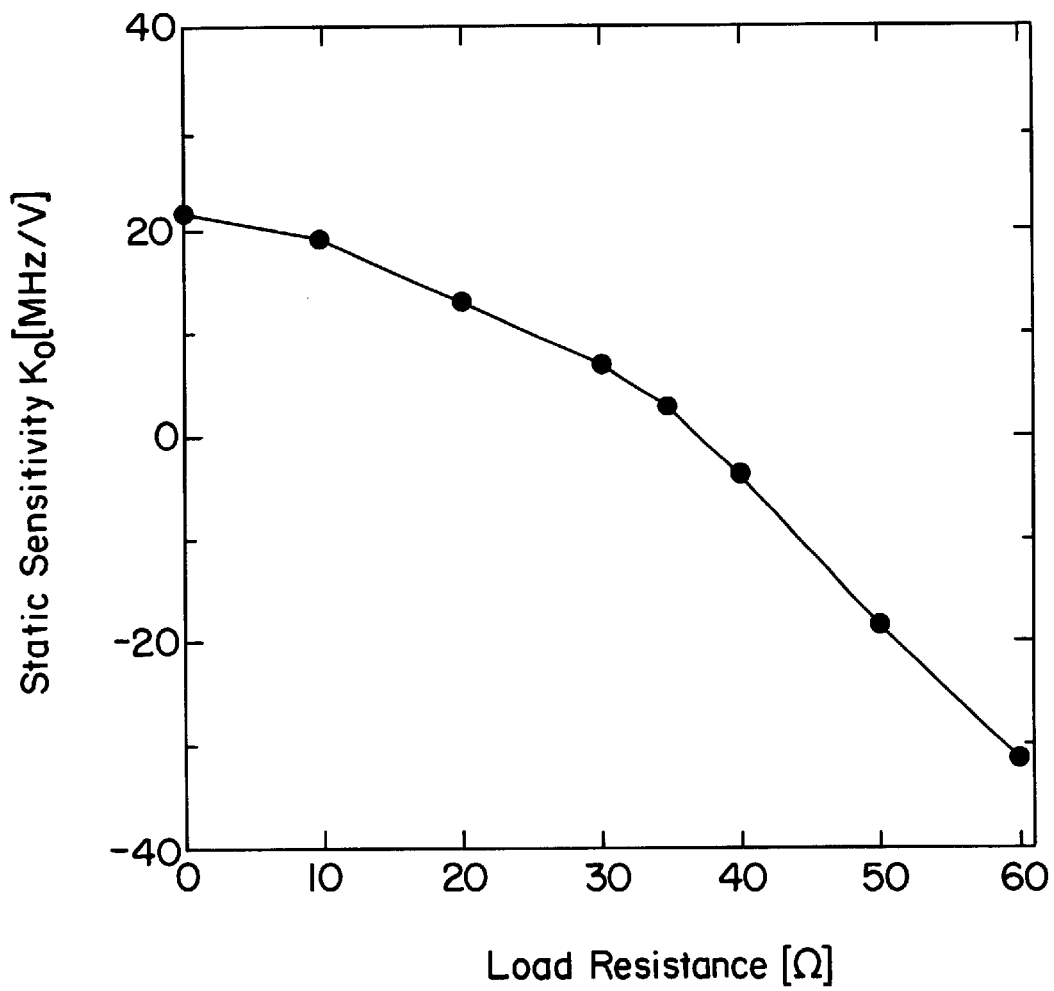
FIG. 3 is a diagram showing the static sensitivity as a function of the load resistance of an inverting amplifier.

FIG. 3 is a diagram depicting the static sensitivity $K_0$ as a function of the load resistance $R_3$.

In the context of the present invention there has been disclosed a currently preferred embodiment of a ring oscillator. It will, however, be understood by those skilled in the art that the invention is not limited to the specific structures disclosed but that certain changes and modification may be made without departing from the scope of the invention which has been defined in the claims.

What is claimed is:

1. A ring oscillator for providing for reduced jitter induced by at least one of a supply voltage and substrate voltage, comprising:
    a first plurality of amplifier stages connected to a first source of voltage; and
    a second plurality of amplifier stages connected to a second source of voltage negatively correlated to the first voltage.

2. The ring oscillator of claim 1, wherein the amplifier stages of the first and second plurality are series connected.

3. The ring oscillator of claim 2, wherein the amplifier stages of the first and second plurality are alternatingly series connected.

4. The ring oscillator of claim 2, wherein the first source of voltage is a global supply voltage and wherein the second source of voltage is connected to the first source of voltage by an inverting amplifier.

5. The ring oscillator of claim 4, wherein the inverting amplifier is dimensioned to reduce the total sensitivity $K = df/dV_{DD}$ to zero.

* * * * *